US010210985B2

(12) United States Patent
Yang et al.

(10) Patent No.: US 10,210,985 B2
(45) Date of Patent: Feb. 19, 2019

(54) COIL COMPONENT

(71) Applicant: SAMSUNG ELECTRO-MECHANICS CO., LTD., Suwon-si, Gyeonggi-do (KR)

(72) Inventors: Ju Hwan Yang, Suwon-si (KR); Seok Il Hong, Suwon-si (KR); Young Seuck Yoo, Suwon-si (KR)

(73) Assignee: Samsung Electro-Mechanics Co., Ltd., Suwon-si, Gyoenggi-do (KR)

( * ) Notice: Subject to any disclaimer, the term of this patent is extended or adjusted under 35 U.S.C. 154(b) by 56 days.

(21) Appl. No.: 15/467,717

(22) Filed: Mar. 23, 2017

(65) Prior Publication Data
US 2018/0047493 A1 Feb. 15, 2018

(30) Foreign Application Priority Data
Aug. 9, 2016 (KR) .................. 10-2016-0101298

(51) Int. Cl.
| H01F 27/28 | (2006.01) |
| H01F 27/24 | (2006.01) |
| H01F 27/29 | (2006.01) |
| H03H 1/00 | (2006.01) |
| H03H 7/42 | (2006.01) |
| H01F 17/00 | (2006.01) |
| H01F 17/04 | (2006.01) |

(52) U.S. Cl.
CPC ......... *H01F 27/24* (2013.01); *H01F 17/0013* (2013.01); *H01F 17/0033* (2013.01); *H01F 17/04* (2013.01); *H01F 27/2804* (2013.01); *H01F 27/29* (2013.01); *H01F 27/292* (2013.01); *H03H 1/00* (2013.01); *H03H 7/427* (2013.01); *H01F 2027/2809* (2013.01); *H03H 2001/0078* (2013.01); *H03H 2001/0092* (2013.01)

(58) Field of Classification Search
CPC ....... H01F 27/24; H01F 27/2804; H01F 27/29
USPC .................................... 336/200, 232
See application file for complete search history.

(56) References Cited

U.S. PATENT DOCUMENTS 6,181,232 B1 * 1/2001 Kitamura ............... H01F 17/04
336/200
2010/0117777 A1 * 5/2010 Tan ..................... H01F 27/2804
336/65

(Continued)

FOREIGN PATENT DOCUMENTS

| JP | H11-54326 A | 2/1999 |
| JP | 2005-116647 A | 4/2005 |

(Continued)

OTHER PUBLICATIONS

Korean Office Action issued in corresponding Korean Patent Application No. 10-2016-0101298, dated Nov. 15, 2017, with English Translation.

Primary Examiner — Tsz Chan
(74) Attorney, Agent, or Firm — Morgan, Lewis & Bockius LLP

(57) ABSTRACT

A coil component includes a body including coil patterns and a plurality of trenches; and external electrodes electrically connected to the coil patterns. The plurality of trenches include a magnetic material, and at least one edge of a trench disposed outside of an outermost coil pattern among the coil patterns has a same shape as an outside boundary portion of the outermost coil pattern adjacent thereto.

15 Claims, 3 Drawing Sheets

(56) References Cited

U.S. PATENT DOCUMENTS

| | | | | |
|---|---|---|---|---|
| 2010/0141370 A1* | 6/2010 | Lu | ............... | H01F 17/0013 336/200 |
| 2014/0009254 A1* | 1/2014 | Ohkubo | ............ | H01F 27/2804 336/192 |
| 2014/0022041 A1* | 1/2014 | Park | ............... | H01F 17/0013 336/199 |

FOREIGN PATENT DOCUMENTS

| | | |
|---|---|---|
| JP | 2007-123352 A | 5/2007 |
| JP | 2010-123876 A | 6/2010 |
| KR | 10-2014-0005088 A | 1/2014 |

\* cited by examiner

COIL COMPONENT

CROSS-REFERENCE TO RELATED APPLICATION(S)

This application claims the benefit of priority to Korean Patent Application No. 10-2016-0101298, filed on Aug. 9, 2016 in the Korean Intellectual Property Office, the entire disclosure of which is incorporated herein by reference.

BACKGROUND

1. Technical Field

The present disclosure relates to a coil component, and, more particularly, to a chip electronic component including a coil, such as a common mode filter.

2. Description of Related Art

Noise filters are required in a high speed digital interface of a smart device such as a display, a USB, etc. Among these, a common mode filter selectively removes common mode noise. Since the magnetic fluxes of a differential mode signal are offset by each other in the common mode filter, no inductance occurs, and thus the differential mode signal is passed, and a magnetic flux by the common mode noise is reinforced, an action of inductance is increased, and thus noise may be removed.

In the related art, a laminate may be interposed between a pair of magnetic substrates. The laminate has insulating layers and two coil conductors stacked through the insulating layers. Through holes are formed in parts corresponding to inner regions of the coil conductors of the insulating layers, and magnetic materials are filled in the through holes. Simultaneously, additional through portions are also formed in parts corresponding to outer regions of the coil conductors of the insulating layers, and magnetic materials are filled in the through portions.

However, since the through holes or the additional through portions have substantially rectangular shapes, they do not sufficiently contribute to an impedance increase of a common mode coil.

SUMMARY

An aspect of the present disclosure may provide a coil component, in particular, a common mode filter, capable of reliably increasing impedance in small size electronic components.

According to an aspect of the present disclosure, a coil component may include a body including a coil and a plurality of trenches, and external electrodes electrically connectable to the coil included in the body. Each of the plurality of trenches is filled with a magnetic material therein. An outer trench, disposed outside of an outermost coil pattern among the trenches, includes a plurality of corners, in which at least one corner that is most adjacent to the outermost coil pattern is formed to have the same shape as an outside boundary portion of the outermost coil pattern. As a result, a maximum area in which magnetic materials can be filled in the trenches may be secured.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Exemplary embodiments of the present disclosure will now be described in detail with reference to the accompanying drawings.

Coil Component

Figure 1:
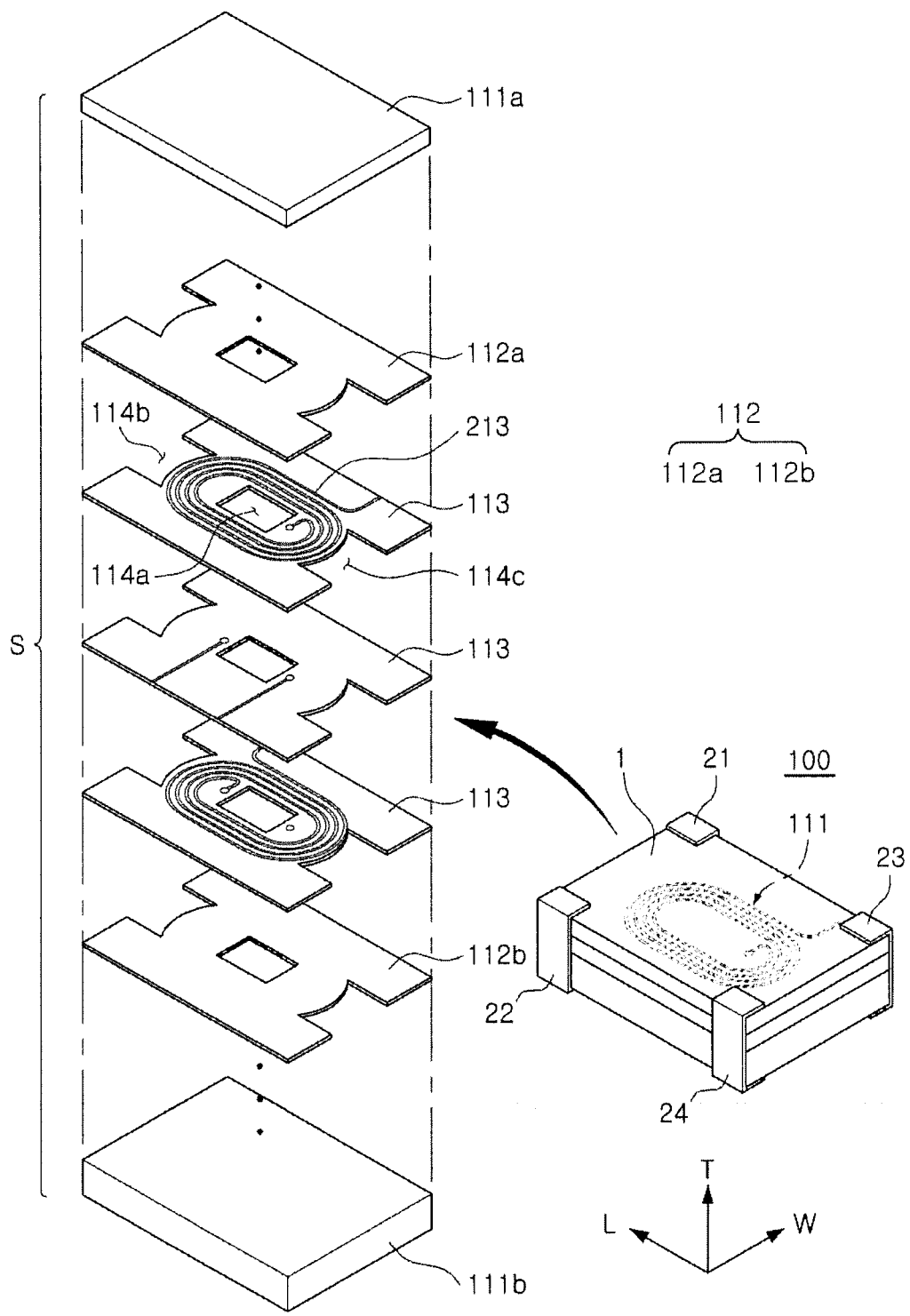
FIG. 1 is a schematic exploded perspective view of a coil component according to an exemplary embodiment in the present disclosure.
Figure 2:
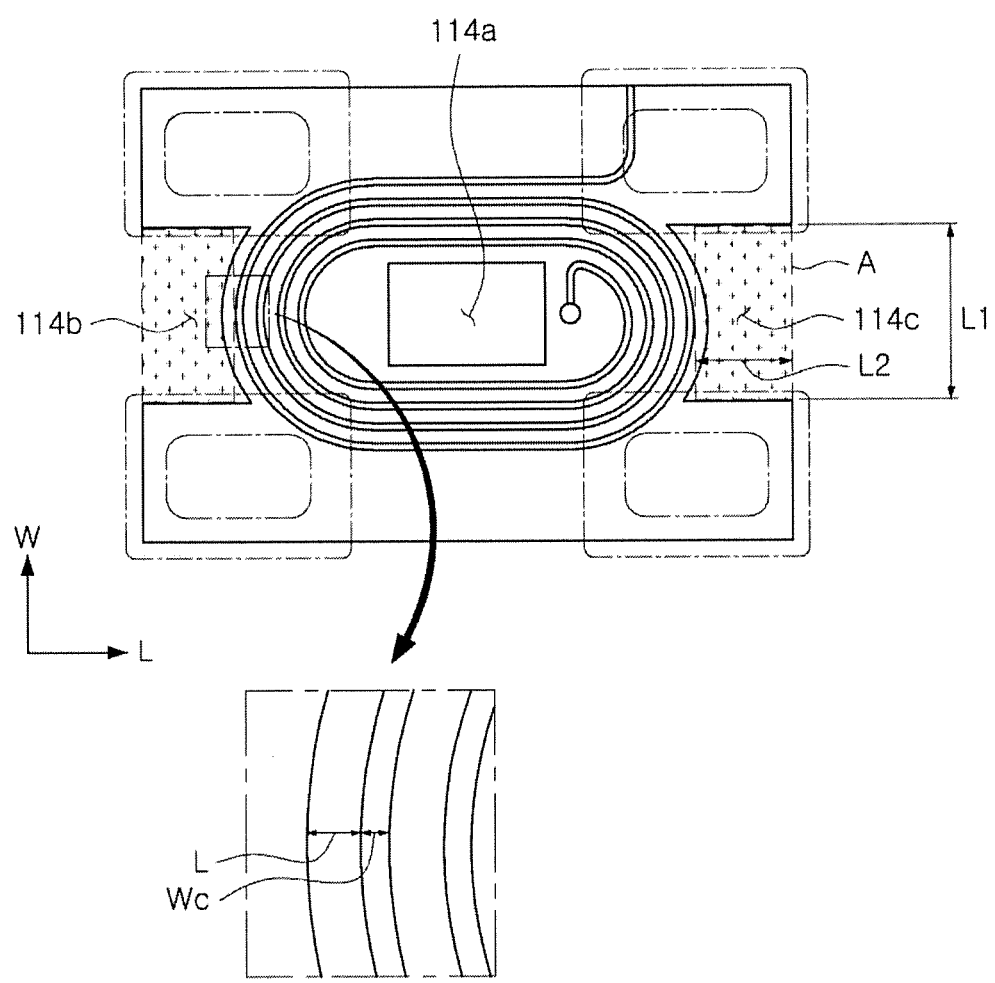
FIG. 2 is a schematic top view of FIG. 1.

FIG. 1 is a schematic exploded perspective view of a coil component 100 according to the present disclosure. FIG. 2 is a schematic top view of FIG. 1.

Referring to FIGS. 1 and 2, the coil component 100 may include a body 1 including a coil pattern 111 and external electrodes 21, 22, 23, and 24 arranged on an external surface of the body 1.

The body 1 may act to form an exterior of the coil component 100 and may include a first surface and a second surface facing each other in a thickness direction, a third surface and a fourth surface facing each other in a length direction, and a fifth surface and a sixth surface facing each other in a width direction to comprise a substantially hexahedral shape but is not limited thereto.

The body 1 may include a magnetic substrate 111 and a laminate S. The laminate S may include a plurality of insulating layers 112 and a plurality of conductor pattern layers 113.

The magnetic substrate 111 may be a substrate including a magnetic material, having magnetic characteristics, and may form a magnetic loop. Thus, the magnetic substrate 111 may include a material having high permeability, a high quality coefficient and an excellent high frequency impedance, and may be sintering ferrite, a complex material of ferrite and resin, etc.

The magnetic substrate 111 may include an upper magnetic substrate 111a arranged on an uppermost surface of the body 1 and a lower magnetic substrate 111b arranged on a lowermost surface of the body 1.

The laminate S may include the plurality of insulating layers 112 and the plurality of conductor pattern layers 113.

Specifically, the conductor pattern layers 113 may be layers in which insulating sheets on which coil patterns are printed are stacked. This means that the insulating sheets including the coil patterns are arranged on substantially the same plane as the conductor pattern layers 113. The insulating sheets may include substantially the same material as the insulating layers 112 and may employ an unlimited number of materials having an insulating characteristic.

The insulating layers 112 may be insulating layers that provide good adhesion between the magnetic substrate 111 and the conductor pattern layers 113, and prevent upper and lower coil patterns of the conductor pattern layers 113 from being separated from each other, and may include a material having excellent insulating and processing properties. For example, the insulating layers 112 may include epoxy resin or polyimide resin. Some of the insulating layers 112 may include upper insulating layers 112a and lower insulating layers 112b. The upper insulating layers 112a may be arranged on a lower surface of the upper magnetic substrate 111*a*. The lower insulating layers 112*b* may be arranged on an upper surface of the lower magnetic substrate 111*b*.

The conductor pattern layers 113 may be electrically connected to the external electrodes 21, 22, 23, and 24 and may act as an inductor. The coil pattern layers 113 may include coil patterns 213 formed on the insulating sheets by using a photolithography process, a plating method, etc. The coil pattern layers 113 may be formed on the insulating layers 112 by using a conductive material having excellent electrical conductivity and processing properties. The conductive material may include, for example, copper (Cu) or aluminum (Al), etc.

The coil patterns 213 may have a spiral shape and may have a withdrawal portion for connection with the external electrodes 21, 22, 23, and 24. When the coil patterns 213 have the spiral shape, the coil patterns 213 may generally have an optimal inductance on planes of the insulating sheets.

Also, the laminate S included in the body 1 may include a plurality of trenches 114*a*, 114*b*, and 114*c*. A trench means a hole portion formed, from upper surfaces of the insulating layers 112 to the magnetic substrate 111, through lower surfaces of the insulating layers 112. The trench may be filled with a magnetic material. For example, the laminate S may be formed by burying magnetic material containing resin in the trench and curing the magnetic material containing resin, but the laminate S is not limited to only this method.

The trenches 114 may include a trench formed inside of an innermost coil pattern among the coil patterns 213 and a trench formed outside of an outermost coil pattern. Throughout the specification, the trench 114*a*, formed inside of the innermost coil pattern, may be referred to as an "inside trench," and the trenches 114*b* and 114*c*, formed outside of the outermost coil pattern, may be referred to as "outside trenches". The purpose of the distinction is to distinguish the trenches 114 according to locations of the trenches 114.

The inside trench 114*a* may be arranged in a location corresponding to a core of the coil patterns 213, may not overlap the coil patterns 213, and is not limited to a specific shape. The inside trench 114*a* may have, for example, a rectangular shape having four corners, but is not limited to a rectangular shape or a square shape. The inside trench 114*a* may have an oval shape corresponding to a shape of the innermost coil pattern of the coil patterns 213.

The outside trenches 114*b* and 114*c* may be plural. Although the outside trenches 114*b* and 114*c* may be arranged in parallel to each other in the length direction of the body 1 and are formed as two outside trenches for convenience of description in the present specification or drawings, trenches may be added by one of ordinary skill in the art, in consideration of characteristics of the trenches, and there is no limit to the number of trenches. For example, the trenches 114 may include a total of four outside trenches, by further including additional outside trenches arranged in parallel to each other in the width direction of the body 1.

The outside trenches 114*b* and 114*c* may be located between adjacent external electrodes and may extend through an entire space between the adjacent external electrodes. For example, the first external electrode 21, the outside trench 114*b*, and the second external electrode 22 may be sequentially arranged in the width direction of the body 1, and, in the same manner, the third external electrode 23, the outside trench 114*c*, and the fourth external electrode 24 may be sequentially arranged in the width direction of the body 1.

The outside trenches 114*b* and 114*c* may each have a structure with a convex inner edge having two apexes with respect to a cross-section and include a total of three edges. In particular, an edge closest to an outermost coil pattern may have a convex shape corresponding to the outermost coil pattern. In this regard, the 'edge having the shape corresponding to the outermost coil pattern' means that an edge closest to the outermost coil pattern among the edges of the outside trenches 114*b* and 114*c* has the same curvature as an outside boundary portion of the outermost coil pattern adjacent thereto.

The shape of the edge closest to the outermost coil pattern, among the edges of the outside trenches 114*b* and 114*c*, may correspond to the coil pattern, and thus an area for filling a magnetic material may be maximized.

A radius of curvature of the edge closest to the outermost coil pattern may be equal to a radius of curvature of a spiral boundary portion of the outermost coil pattern adjacent thereto.

A minimum distance L, between the edge closest to the outermost coil pattern among the edges of the outside trenches 114*b* and 114*c* and the outermost coil pattern, may have a value of more than 0 and less than 2 times a width Wc of the coil pattern. When the minimum distance L exceeds 2 times the width Wc of the coil pattern, a valid area for trench formation may not be maximum, and the minimum distance L may be equal to 0, which makes it difficult to insulate the coil patterns from each other when the outermost coil pattern and the edges of the outside trenches 114*b* and 114*c* overlap each other.

Meanwhile, shapes of the two edges, except for the edge having the shape corresponding to the outside boundary portion of the outermost coil pattern among the edges of the outside trenches 114*b* and 114*c*, will now be described.

The two edges adjacent to the edge having the shape corresponding to the outside boundary portion of the outermost coil pattern and facing each other may be disposed in parallel to each other and may have a shape parallel to the edge of the outer surface of the body 1.

In summary, the outside trenches 114*b* and 114*c* may include the total of three edges in which the edges except for the single edge closest to the outermost coil pattern are arranged in parallel to the outer surface of the body 1, whereas the single edge closest to the outermost coil pattern has the same shape as the outside boundary portion of the outermost coil pattern. As a result, compared to an outside trench, having the same shape as a lower surface of a body, an additional area extending toward the outermost coil pattern may be secured.

As shown in FIG. 2, the outside trenches 114*b* and 114*c* may be formed to have a greater area than a virtual rectangular area A, with a minimum distance L1 between external electrodes facing each other in a width direction of the laminate S and a distance L2 from one end portion of the laminate S in a length direction of the laminate S to the outside boundary portion of the outermost coil pattern. This means that, when outside trenches of the present disclosure are formed outside of coils, the coil component 100, having a maximum space for filling a magnetic material, may be provided, compared to conventional laminates having schematically rectangular shapes.

Figure 4:
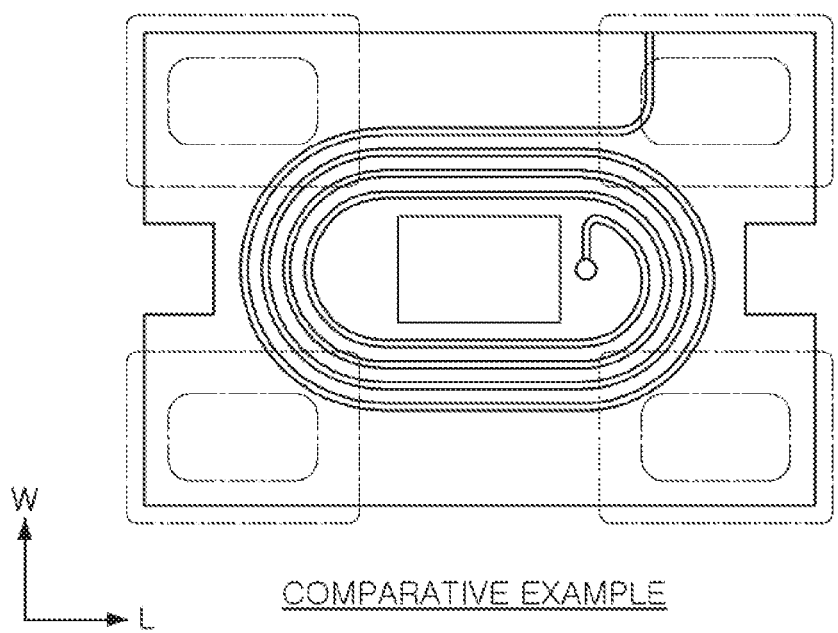
FIG. 4 is a schematic top view of a coil component corresponding to a comparative example.

A common mode filter product having a complex structure of the inside trench 114*a* and the outside trenches 114*b* and 114*c*, according to an exemplary embodiment in the present disclosure, may produce an effect of an impedance capacity increase of about 30%, compared to a common mode filter product (see FIG. 4) having a conventional rectangular trench structure both inside and outside. Specifically, even though the conventional product differs from the present disclosure only in a trench shape, the conventional product has an impedance capacity of 30 ohm, whereas an exemplary embodiment of the present disclosure exhibits an impedance capacity of 44 ohm.

The trenches 114 may be physically separated from coils.

A method of forming the trenches 114 is not limited. For example, the trenches 114 may be formed through laser processing.

The coil component 100 may include the external electrodes 21, 22, 23, and 24, electrically connected to the coil patterns. The external electrodes 21, 22, 23, and 24 may include a material having an excellent electrical conductivity and may be formed through, for example, electric plating but is not limited thereto.

Figure 3:
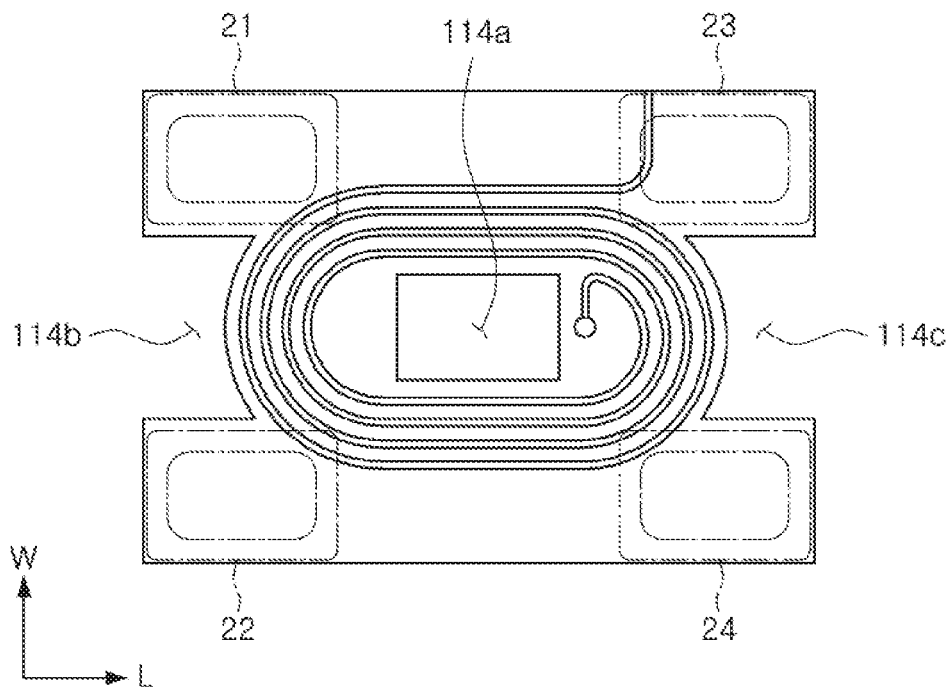
FIG. 3 is a schematic top view of a modified example in which a shape of an external electrode is changed.

Although the external electrodes 21, 22, 23, and 24 have band portions extending to the lower surface or the upper surface of the body 1 in FIGS. 1 and 2, as briefly shown in FIG. 3, the external electrodes 21, 22, 23, and 24 may also be formed in only the lower surface of the body 1 as lower electrodes.

The external electrodes 21, 22, 23, and 24 of FIGS. 1 and 2 may be arranged on corner portions of the lower surface of the body 1 and in peripheral regions adjacent thereto. Through such an arrangement, an optimal space for the outside trenches 114b and 114c may be provided between the external electrodes 21, 22, 23, and 24. Likewise, the external electrodes 21, 22, 23, and 24 of FIG. 3 are merely different from the external electrodes 21, 22, 23, and 24 of FIGS. 1 and 2 in that the external electrodes 21, 22, 23, and 24 of FIG. 3 are arranged only in the lower surface of the body 1 and do not extend to another surface of the body 1, but are the same as the external electrodes 21, 22, 23, and 24 of FIGS. 1 and 2 in that an optimal space for the outside trenches 114b and 114c may be provided between the external electrodes 21, 22, 23, and 24, arranged on corner portions of the lower surface of the body 1 and on peripheral regions adjacent thereto.

In the coil component 100 according to an exemplary embodiment in the present disclosure, in a situation in which an impedance capacity is insufficient as an electronic device becomes smaller, while a size of an entire chip, insulation of coils and the number of turns of coils may be maintained, an electrical characteristic may be remarkably improved by maximizing a filling portion of a magnetic material.

As set forth above, according to exemplary embodiments in the present disclosure, the coil component capable of increasing a transmission characteristic of an electronic device by improving impedance of the common mode filter may be provided.

While exemplary embodiments have been shown and described above, it will be apparent to those skilled in the art that modifications and variations could be made without departing from the spirit and scope of the present disclosure as defined by the appended claims.

What is claimed is:

1. A coil component comprising:
a body including coil patterns and a plurality of trenches; and
external electrodes electrically connected to the coil patterns,
wherein the plurality of trenches include a magnetic material,
wherein at least one edge of a trench disposed outside of an outermost coil pattern among the coil patterns has a same shape as an outside boundary portion of the outermost coil pattern adjacent thereto, and
wherein a minimum distance between an edge of an outside trench, having the same shape as the outside boundary portion of the outermost coil pattern, and the outermost coil pattern, is more than 0 and less than 2 times a width of the coil patterns.

2. The coil component of claim 1, wherein the plurality of trenches include a trench having a convex edge.

3. The coil component of claim 1, wherein the plurality of trenches include a trench having two apexes.

4. The coil component of claim 1, wherein the plurality of trenches include an inside trench formed inside of an innermost coil pattern and outside trenches formed outside of the outermost coil pattern,
wherein the inside trench is singular, and the outside trenches are plural, and
wherein the plurality of outside trenches have a same shape and are arranged to be symmetrical to each other with respect to the inside trench.

5. The coil component of claim 4, wherein the inside trench and the plurality of outside trenches are arranged in a line in one direction of the body.

6. The coil component of claim 4, wherein each of the plurality of outside trenches is disposed between external electrodes facing each other in one direction of the body.

7. The coil component of claim 1, wherein the coil patterns have a spiral shape, and
wherein a radius of curvature of at least one edge of an outside trench disposed outside of the outermost coil pattern is equal to a radius of curvature of a spiral boundary portion of the outermost coil pattern adjacent thereto.

8. The coil component of claim 1, wherein the external electrodes are formed as lower electrodes arranged in at least a partial portion of a lower surface of the body.

9. The coil component of claim 1, wherein edges, except for an edge having the same shape as the outside boundary portion of the outermost coil pattern among the edge of the plurality of trenches, have a straight line shape.

10. The coil component of claim 4, wherein the inside trench has a same shape as an inside boundary portion of an innermost coil pattern.

11. A coil component comprising:
a laminate arranged between upper and lower magnetic substrates; and
external electrodes arranged on an outer surface of the laminate,
wherein the laminate includes a plurality of insulating layers and conductor pattern layers, the conductor pattern layers including coil patterns on insulating sheets, and an outside boundary portion of an outermost coil pattern among the coil patterns has an oval shape having a length direction of the laminate as a major axis,
the laminate includes a plurality of trenches that penetrate the plurality of insulating layers and the insulating sheets of the conductor pattern layers,
the plurality of trenches includes an outside trench arranged outside of the coil patterns, and
the outside trench has an area greater than a virtual rectangular area A including a minimum distance L1 between the external electrodes facing each other in a width direction of the laminate and a distance L2 from one end portion of the laminate in a length direction of the laminate to the outside boundary portion of the outermost coil pattern.

12. The coil component of claim 11, wherein the plurality of trenches include an inside trench formed inside of the coil patterns, and wherein the inside trench has a same shape as an inside boundary portion of an innermost coil pattern.

13. The coil component of claim 11, wherein the plurality of trenches include an inside trench formed inside of the coil patterns, and wherein the inside trench has a rectangular shape.

14. The coil component of claim 11, wherein the plurality of trenches includes a trench having a convex edge.

15. The coil component of claim 11, wherein the plurality of trenches includes a trench having two apexes.

\* \* \* \* \*